(12) United States Patent
Freytag

(10) Patent No.: US 7,564,244 B2
(45) Date of Patent: Jul. 21, 2009

(54) RF RESONATOR SYSTEM AND METHOD FOR TUNING AN RF RESONATOR SYSTEM

(75) Inventor: Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/979,755

(22) Filed: Nov. 8, 2007

(65) Prior Publication Data

US 2008/0111550 A1    May 15, 2008

(30) Foreign Application Priority Data

Nov. 14, 2006   (DE) ................. 10 2006 053 472

(51) Int. Cl.
*G01V 3/00* (2006.01)
(52) U.S. Cl. .................... 324/318; 324/309
(58) Field of Classification Search ......... 324/300–322; 600/407–422; 333/227, 219
See application file for complete search history.

(56) References Cited

U.S. PATENT DOCUMENTS

| | | | | |
|---|---|---|---|---|
| 5,466,480 | A * | 11/1995 | Zhou et al. | 427/63 |
| 6,169,399 | B1 | 1/2001 | Zhang | |
| 6,727,702 | B2 * | 4/2004 | Hammond et al. | 324/318 |
| 7,078,902 | B2 * | 7/2006 | Freytag et al. | 324/318 |
| 7,190,165 | B2 * | 3/2007 | Hammond et al. | 324/318 |
| 7,295,009 | B2 * | 11/2007 | Withers | 324/318 |
| 7,304,277 | B2 * | 12/2007 | Weber | 219/674 |
| 7,369,010 | B2 * | 5/2008 | Alvarez et al. | 333/99 S |
| 2004/0021466 | A1 | 2/2004 | Hammond | |
| 2005/0256009 | A1 | 11/2005 | Alvarez | |

FOREIGN PATENT DOCUMENTS

| | | |
|---|---|---|
| DE | 35 06 471 | 8/1986 |
| JP | 04-368006 | 12/1992 |
| JP | 05 056948 | 3/1993 |
| JP | 05 199007 | 8/1993 |
| WO | WO 2004/084340 | 9/2004 |
| WO | WO 2004/102596 | 11/2004 |

OTHER PUBLICATIONS

Koneval D J et al.: "Improved VHF filter crystals using insulating film techniques". Symp Frequency Control; Symposium on Frequency Control, 1966, Pa. 103-130.

* cited by examiner

*Primary Examiner*—Brij B Shrivastav
(74) *Attorney, Agent, or Firm*—Paul Vincent

(57) ABSTRACT

A radio-frequency (RF) resonator system, in particular, for a magnetic resonance (MR) probe, comprising at least one RF resonator with a substrate, on which a conductive structure is applied, wherein the conductive structure comprises regions of capacitive and inductive elements, is characterized in that the conductive structure is coated at least in the regions of the capacitive elements with at least one dielectric layer that covers the regions of the capacitive elements at least partially, wherein the local thickness of at least one of the dielectric layers is set in dependence on the resonance frequency of the uncoated RF resonator, on a defined resonance frequency of the resonator once it is coated, on the dielectric constant of the substrate and on the dielectric constant of the materials of the dielectric layers. The inventive resonator system can be set to the required resonance frequency quickly, at low cost, reversibly, and with high precision and at the same time the dielectric strength of the resonator system is increased.

20 Claims, 5 Drawing Sheets

PRIOR ART

RF RESONATOR SYSTEM AND METHOD FOR TUNING AN RF RESONATOR SYSTEM

This application claims Paris Convention priority of DE 10 2006 053 472.7 filed Nov. 14, 2006 the complete disclosure of which is hereby incorporated by reference.

BACKGROUND OF THE INVENTION

The invention relates to a radio-frequency (RF) resonator system, in particular, for a magnetic resonance (MR) probe, comprising at least one RF resonator with a substrate, to which a conductive structure is applied, wherein the conductive structure comprises areas with capacitive and inductive elements. Moreover, the invention relates to a method for tuning such an RF resonator system.

Such RF resonator systems are known from [7] and the references cited therein.

For MR applications, RF resonator systems are used to irradiate RF pulses and detect RF signals from the measurement samples. An RF resonator system can comprise one or more RF resonators. In the case of high-resolution MR apparatus, the sensitivity of the apparatus can be increased by using high-temperature superconductor (HTS) resonators. Such resonators are usually structured lithographically from HTS films on planar substrates. However, defects that have to be compensated for in the construction of the MR probe can arise in the lithography. These defects can manifest themselves, for example, by an increase or decrease in the resonance frequency of a resonator.

A distinction is made here between "tuning" and "trimming". The term "tuning" describes a mechanism whereby the resonance frequency of a resonator or resonator system can be changed reversibly under the working conditions intended for the system. In the case of a nuclear magnetic resonance (NMR) probe, this tuning is necessary to correct frequency changes of the resonator system when it is loaded with measurement samples as opposed to when it is empty. The resonance frequency of the resonator system changes when a measurement sample is introduced because the resonators not only generate magnetic fields that are used to transmit and receive the nuclear magnetic resonance signals but also electrical fields in the sample volume. Because the measurement samples exhibit different dielectric constants (at room temperature $\epsilon \approx 80$ for water, $\epsilon \approx 21$ for acetone, $\epsilon \approx 4.8$ for chloroform and $\epsilon \approx 2.2$ for benzene), the resonance frequency of the probe has to be readjusted when the measurement sample is changed.

The term "trimming" denotes a mechanism that sets the resonance frequency of a resonator or resonator system once. This is done before or at the time of completion of the product. In the case of an NMR probe, trimming refers to setting a resonance frequency of the resonator systems so that the tuning range of the apparatus in question is sufficient to allow tuning to the resonance frequency of the measured nuclei in the given static magnetic field $B_0$ with all measurement samples. Trimming relates both to the correction of errors that arise during the manufacture of resonators and to methods by which the resonators are deliberately manufactured with a resonance frequency higher or lower than the set target frequency and are subsequently trimmed. This method can increase the yield of the manufacturing process.

A common method for trimming resonators for NMR probes is to set the resonance frequency of the coils by laser trimming. This is, for example, known from reference [2] in the case of spiral resonators for which this method works very simply and successfully. In NMR, however, other types of resonators are also used, in particular, those with many interleaved conductors, called "resonators with localized capacitances" or "resonators with distributed capacitances".

In the case of such resonators, it is most expedient to trim all the capacitances, if possible, evenly by shortening the overlap lengths of the conductors, as shown in FIG. 5. The problem is that, in realistic embodiments, the distance between the conductors is just 2 to 10 μm, making it difficult to interrupt conductors without damaging adjacent conductors. Moreover, the cut conductors would have to be rounded to avoid producing spikes at which breakdowns could occur during resonance. The problem with this is, in particular, that the greatest voltage differences between adjacent conductors occur at the ends of the finger capacitors, i.e. at the location of the "damage" due to laser trimming. In experiments, it is quickly shown that coils trimmed in this way tend to "arc", i.e. suffer electrical breakdowns during operation and are therefore usually unusable.

This problem is less extensive in spiral resonators because the local electrical field intensity (i.e. the voltage between adjacent conductor elements) is significantly lower than in other types of resonator. However, such spiral resonators have only limited uses in NMR because their resonance frequency is low and the electric fields and therefore the dielectric losses in the measurement samples and the frequency shifts are very high when the sample is changed. Moreover, their current-carrying capacity is limited.

From reference [7], resonators are known in which each conductor element has to be trimmed individually because otherwise the advantages of the adapted current maxima in each conductor would be lost. However, this requires that the conductors can be cleanly cut and the cuts rounded off. Laser systems with such a high mechanical resolution in the sub-micrometer range are extremely expensive and trimming is time-consuming and therefore inefficient.

An alternative method for laser trimming is to trim in "digital" steps. This involves cutting off a single "finger" of the resonator (FIG. 6). This makes the entire conductor (and possibly a second conductor that is linked to this conductor) almost free of current and no voltage arises. This prevents breakdowns on the trimmed conductor. The disadvantage of this method is that only some of the conductors carry current and the distribution of the currents over the conductors is uneven. The resonator can also only be trimmed relatively roughly and fine graduations are not possible.

A further decisive disadvantage of the laser trimming method is that it is an irreversible process. If the frequency shift is too large, it can no longer be corrected and the resonator is unusable.

As an alternative to laser trimming, the conductive structure can be modified using chemical or mechanical etching processes such that the resonance frequency is correctly set. However, in this case, too, trimming is irreversible and the effort is enormous because the masking has to be aligned with the resonator in the sub-micrometer range. It is an advantage if structuring by laser trimming is performed with the same high quality as the original manufacturing, i.e. trimming does not result in any "damage" that could cause electric breakdowns. The only realistic method for implementing such a trimming method is direct inscribing of the structure using a laser or electron beam on a photomask. This method is also extremely expensive and time-consuming.

A further problem in construction of the probe is that the mounting of the substrates exhibits certain mutual tolerances. This varies the resonance frequency of the Helmholtz mode that is used, for example, for NMR over several MHz, in the best case by approximately 1 to 2% (corresponding to about 1 MHz for protons). In reference [6], this known property of coupled resonators is utilized to permit tuning of the mode. For HTS resonator systems that are used in high-resolution NMR, this is completely unsuitable because movement of resonators for tuning in the static magnetic field results in massive distortions of the static magnetic field $B_0$ due to the Landau effect. This method is only suitable for trimming, not for tuning, the resonator for high-resolution NMR.

To compensate for these mounting tolerances, a sufficiently wide tuning range of the probe can be chosen to permit the resonance frequency to be nevertheless set. However, the disadvantage is that all common methods for tuning HTS resonators result in quality factor and/or efficiency losses of the resonators. For this reason, an excessively wide tuning range is not desirable.

Alternatively, these defects can be compensated for after mounting using adjustment screws and the resonators not definitively fastened until the resonance frequency has been correctly set. However, this demands a great effort of mechanical precision because the positioning must be precise to approximately 100 µm.

In microwave technology, a method for trimming dielectric resonators using local metallization is known [1].

For filters it is also known that dielectric bodies ("tuning elements") can be moved in the region of the electric fields of the resonators to change the eigen-resonances [3], [4]. As an alternative, it is also known that the ground plane can be changed relative to the resonators, which changes the resonance frequency [5].

The objective of the invention is to propose a radio-frequency (RF) resonator system of the type mentioned above, which can be manufactured simply, achieving a defined resonance frequency with high precision and changing the ratios of the capacitances between the individual conductor elements only slightly. Moreover, it is the objective of the invention to propose a method for trimming a resonator system wherein the waste due to manufacturing defects is low.

SUMMARY OF THE INVENTION

This objective is solved inventively by coating the conductive structure at least in the regions of the capacitive elements with at least one dielectric layer that covers at least partly the regions of the capacitive elements, wherein the local thickness of at least one of the dielectric layers is set, dependence on the resonance frequency of the uncoated RF resonator, on a defined resonance frequency of the resonator once it is coated, on the dielectric constant of the substrate, and on the dielectric constant of the materials of the dielectric layers.

The desired resonance frequency of the resonator system is determined by the local thickness of the dielectric layers and their dielectric constants, which can vary with the surface of the resonator. Dielectric layers that exhibit the dependency described above, that is, on the defined resonance frequency of the resonator once it is coated, on the dielectric constant of the substrate and on the dielectric constant of the materials of the dielectric layers, are termed "trim layers" hereafter. In addition to at least one trim layer, the inventive resonator system can comprise further dielectric layers whose thickness and dielectric constant influence the thickness of the trim layers.

The inventive RF resonator system proves especially advantageous if the conductive structures contain high-temperature superconductor (HTS) material. HTS resonators are used, for example, in high-resolution NMR, MR imaging (MRI) and nuclear quadrupole resonance (NQR) because they result in a vast improvement of the signal-to-noise ratio due to their low electrical losses. Furthermore, they are used in radio-frequency filters, e.g. for telecommunication applications, radar systems etc. because especially low-noise, low-loss filters with simultaneously high edge steepness can be constructed using HTS resonator structures.

It is especially simple to manufacture an inventive RF resonator system if the local thickness of at least one of the dielectric layers is constant over the entire surface of the layer. In an especially preferred embodiment, the local thickness of the layer over all regions of the RF resonator and, in particular, over even the entire substrate has the same value.

An inventive RF resonator system is simplest and therefore also most economical to manufacture if at least one of the dielectric layers completely covers the regions of the capacitive elements. The trim layer can also act as a protective layer against electric breakdowns.

It is advantageous for at least one of the dielectric layers to be of a material with a dielectric constant in the range 2 to 26.

In one advantageous embodiment of the inventive RF resonator system, at least one of the dielectric layers contains a material that is chemically resistant to solvents, in particular, against alcohol and/or acetone and/or water, and is impermeable, in particular, to water vapor. This ensures that the inventive resonator system is compatible with common cleaning processes and the trimming layer can simultaneously be used as a protective layer against chemical and mechanical damage for the sensitive resonator structures.

To implement a high quality of the resonator system, it is advantageous if at least one of the dielectric layers contains a material that exhibits an electric conductivity $\sigma$ where $\sigma<10^{-3}$ S/m, preferably $\sigma<10^{-5}$ S/m, in particular, $\sigma<10^{-8}$ S/m and/or a low loss factor $\tan \delta$, where $\tan \delta<10^{-3}$, in particular $\tan \delta<10^{-5}$.

In an especially preferred embodiment, the dielectric layers consist of materials that exhibit a largely temperature-independent dielectric constant. "Largely temperature-independent" is used to mean a maximum deviation of the dielectric constant of 10% within a temperature range of 15 K to room temperature, preferably less than 1% in a temperature range of 10 K to 90 K. This reduces the requirements and the stability of temperature control of the resonators during operation.

RF resonator systems are especially suitable in which at least one of the dielectric layers contains polymers, in particular Parylenes, and/or fluorinated polymers, in particular, fluorinated ethylene propylene copolymer (=FEP), perfluoroalkoxy copolymer (=PFA), polytetrafluoroethylene (=PTFE), and/or oxides and/or nitrides. Parylene is the generic name for members of a polymer series. The basic member of the series, called Parylene N, is poly-para-xylylene, The other members of the polymer series are obtained by substitution of one or more halide atom for one of the aromatic hydrogens.

In particular, Parylenes have the advantage that they can be deposited from the gas phase completely isotropically at room temperature or colder producing pin hole free films as thin as a fraction of a micrometer to as thick as several tens of micrometers. This is an advantage, in particular, in HTS resonator systems because deposition from the gas phase lowers the risk of damage to the HTS film by overheating or solvents and acids/alkalis. Parylenes show very little transmission of moisture vapor and very good permeation properties to almost all organic solvents. Furthermore, Parylenes have particularly good properties for cryogenic applications: the low temperature flexibility is two to six times better than for polyethylene, polyethylene terephthalate, and polytetrafluoroethylene. Neither electrical nor physical properties are affected by cycling from cryogenic to room temperature. Furthermore, the vacuum stability of the material is very good an almost no outgassing can be detected. These unique properties make Parylene one of the best materials for coating RF resonator systems in the inventive manner.

To prevent discharges, it is an advantage if at least one of the dielectric layers, in particular, the layer that is applied directly to and around capacitive elements of the resonator system, exhibits a dielectric strength that is greater than $10^7$ V/m, in particular greater than $10^8$ V/m.

In an especially preferred embodiment, the material of the dielectric layer exhibits a similar dielectric constant to the substrate, where the dielectric constant of the dielectric layer, in particular, is between half and double the value of the dielectric constant of the substrate.

In particular, in the case of RF resonator systems with very thin layers, the dielectric constant of the dielectric layers advantageously decreases with increasing distance from the conductive structures. In particular, it is an advantage if the first layer exhibits a dielectric constant that is matched to that of the substrate. This avoids step changes in the dielectric constant and therefore local increases in the electric fields in the region of high field intensities.

In a preferred embodiment of the invention, the substrate contains a material with a dielectric constant in the range 9 to 25, in particular $LaAlO_3$, MgO, $Al_2O_3$, $YAlO_3$. HTS can be grown on these materials especially simply and with good layer properties.

An MR probe with an inventive RF resonator system is also advantageous. The resonator system can be trimmed to the target frequency especially simply, fast, efficiently and at low-cost, and exhibits high dielectric strength, low electrical losses, and high efficiency.

The invention also relates to a method for tuning an RF resonator system whereby, at least in the regions of the capacitive elements, at least one dielectric layer is applied to the conductive structure that, after application, covers at least partly the regions of the capacitive elements, wherein the local thickness of at least one of the dielectric layers is chosen in dependence on the resonance frequency of the uncoated resonator, on a target resonance frequency of the resonator once coated, on the dielectric constant of the substrate and on the dielectric constant of the materials of the dielectric layers.

Setting the required resonance frequency is performed by choosing the thickness of the dielectric layers. In principle, it is enough to cover at least one region at which a high electrical field prevails with a dielectric layer. To additionally protect the resonator system against breakdowns, it is advantageous to coat all regions in which the electric fields are strongest to distribute the electric fields as homogeneously as possible over the space and avoid large step changes in the dielectric constant, especially, at spikes and edges. The dielectric layer can be applied with varying thicknesses to different points of the resonator so that the local thicknesses of the layer vary over the surface of the resonator. To achieve the most homogeneous possible current distribution as well, it is advantageous if the surface of the resonator to which the conductive structures are applied is completely covered by the dielectric layer or layers. Coverage should then be largely even over the surface of the resonator system, i.e. the thickness variation should be under 10%, if possible. For such resonator systems, the distribution of the current density in the conductor elements is especially simple to calculate and adapt and the adaptation is independent of the set resonance frequency, i.e. trimming. Furthermore the constant coverage with a dielectric layer reduces the perturbation of the static magnetic field if the inventive resonator system is to be used in a magnetic resonance probe.

In an advantageous variant of the inventive method, after application of the first dielectric layer, a further dielectric layer is applied to the first dielectric layer and/or the conductive structure. In this way, for example, coating is possible with a gradient with respect to the dielectric constant, or a first layer can be applied that is better suited for protection against electric breakdowns.

Preferably, deposition of the dielectric layer on the conductive structures is performed by evaporation, plasma depositing, sputtering or from the solution. These deposition methods are reproducible and simple to perform.

In an advantageous variant of the inventive method, after application of the dielectric layer, part of this layer is removed again, in particular, by an etching process. In this way, corrections to the local thickness can be performed after deposition, in particular, if the thickness is not sufficiently precisely controlled while applying the layers or if multiple resonators are to be coated at the same time, although trimming of the resonators requires different layer thicknesses. In this way, coating can be performed at particularly low cost.

To set the thicknesses of the dielectric layers, it is advantageous if, between application of the first dielectric layer and the further dielectric layer, the resonance frequency of the RF resonator coated with the first dielectric layer is determined. In that way, coating thickness errors of the first layer can be corrected. Moreover, an iterative method with many layers can be used for trimming.

A method whereby an especially high yield can be achieved involves, after application of the first dielectric layer, mounting pairs of RF resonators with different resonance frequencies to form a Helmholtz pair, the target frequencies of the individual resonators being a function of the target frequency of the pair and the coupling between the resonators (depending, for example, on the distance).

Further advantages of the invention derive from the description and the drawing. Similarly, the features stated above and below can be used individually or multiply in any combinations. The embodiments described and shown are not to be understood as an exhaustive list but are examples to explain the invention.

BRIEF DESCRIPTION OF THE DRAWING

FIG. 4b, 4c a top view of the conductive structures of the resonator system from FIG. 4a;

DESCRIPTION OF THE PREFERRED EMBODIMENT

In the inventive method, the required resonance frequency of the resonators is set by varying the capacitances without varying the conductive structures (conductors). For this purpose, the resonator is coated with a dielectric material, the resonance frequency being determined by choosing the thickness of the dielectric layer.

Figure 1A:
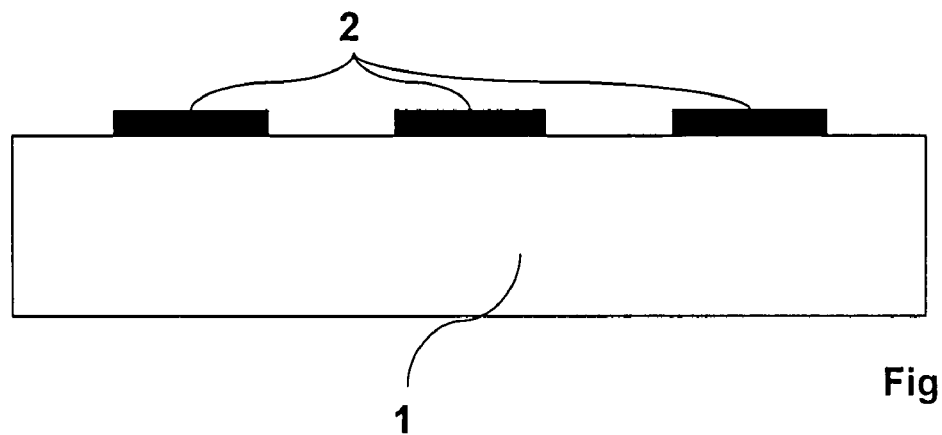
FIG. 1a a schematic section of a region of capacitive elements of a resonator with conductive structures.
Figure 1B:
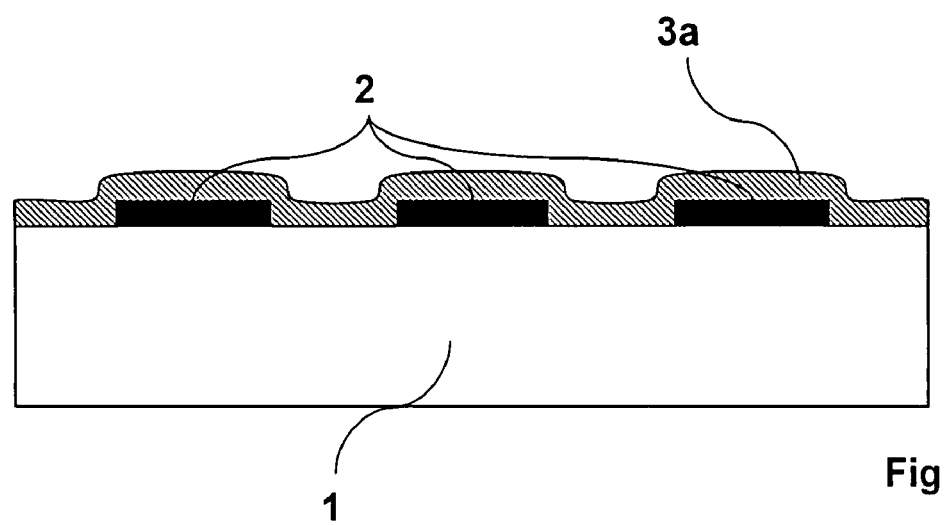
FIG. 1b a schematic section of a region of capacitive elements of an inventive resonator, wherein the conductive structures are coated with a thin dielectric layer.
Figure 1C:
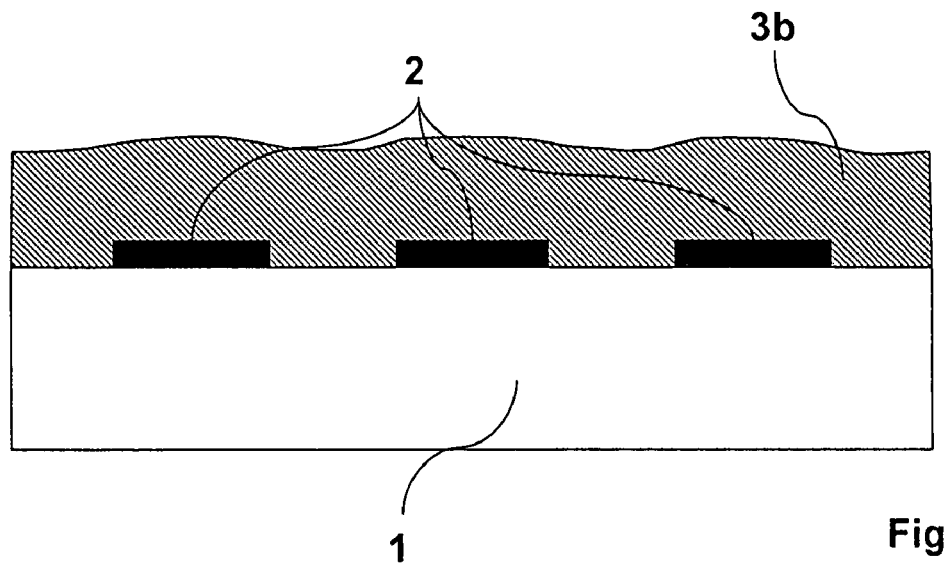
FIG. 1c a schematic section of a region of capacitive elements of an inventive resonator, wherein the conductive structures are coated with a thick dielectric layer.

FIG. 1a shows a section through a substrate 1 and the conductive structures (conductors 2), e.g. within the finger capacitances of an HTS resonator or conductors of spiral resonators. FIG. 1b shows the corresponding resonator that is inventively coated with a dielectric layer 3a of little thickness. FIG. 1c shows an inventive resonator with a coating 3b with great thickness. For simple manufacturing, the inventive resonators, as shown in FIGS. 1b and 1c, are fully coated with a dielectric layer. However, it is possible to leave irrelevant regions uncoated.

In addition to the setting of the resonance frequency of the resonator system, the dielectric strength of the resonator system can be increased by coating the resonators with dielectric layers. In that way, resonators with high pulse power can be operated and shorter pulse angles can be achieved, which is an advantage, in particular, for use in NMR.

As regards the dielectric strength, it is an advantage to achieve the best possible coverage of the current-carrying elements (conductors 2) with a dielectric layer 3a, 3b. Moreover, it is an advantage to minimize step changes in dielectric constants, in particular, in the region of high electric field intensities. These step changes result in voltage peaks and therefore in electric breakdowns. Dielectric step changes should occur if possible in the region of electric fields, i.e. far away from the conductors.

Figure 2:
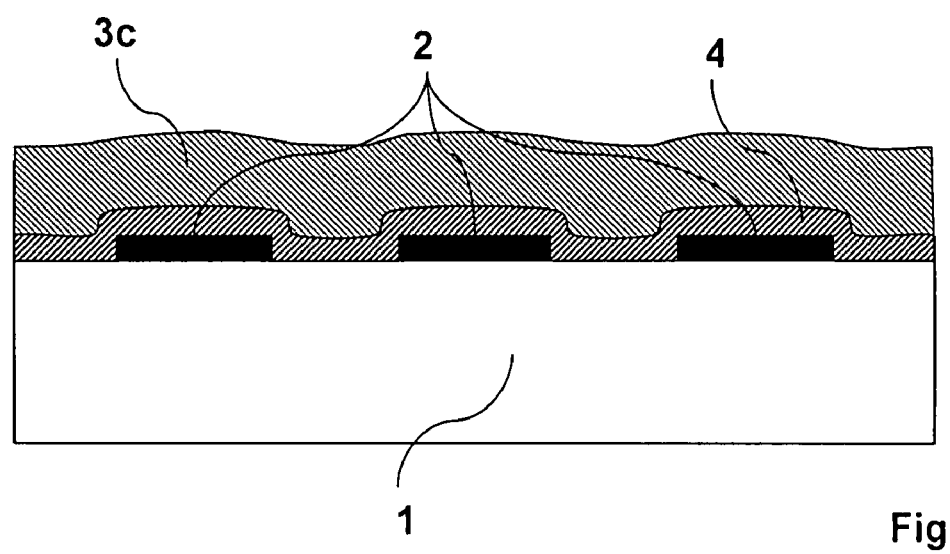
FIG. 2 a schematic section of an inventive resonator in which the conductive structures are coated with two dielectric layers.

In principle, only a single dielectric layer is necessary to achieve the defined resonance frequency of the resonator. However, it can be an advantage to have, in addition to a trimming layer, a thin dielectric layer (protective layer) against electric breakdowns whose dielectric constant is similar to that of the substrate 1. This can prevent electric breakdowns or at least reduce them. In an especially advantageous embodiment of the inventive resonator system, the conductors 2 are therefore initially "packaged" with a material of similar dielectric constant to that of the substrate (protective layer 4) and then trimming is performed in an outer region with a second dielectric layer 3c (trimming layer) (FIG. 2). In this case, the same material can be used for the trimming layer 3c as for the protective layer 4 or a material of higher or lower dielectric constant can be used. Because the field intensities in the outer area, i.e. in the region of the trimming layer 3c, are much lower than near to the conductors, the problem of the step change in dielectric constant is reduced. For that reason, the trimming layer 3c can consist of a material with a higher dielectric constant without reducing the dielectric strength of the resonators. This means that a sufficient trimming range can also be ensured if the trimming layer is relatively far from the conductors.

Ideally, the coating (protective layer 4 and trimming layer 3c) is implemented as a gradient with a dielectric constant that decreases as the distance from the conductor paths 2 increases. However, this is only important if the coating is very thin and technologically extremely complex. Such a gradient can, for example, be implemented by forming a superstructure (superlattice) from two or more different materials.

It may also be necessary to apply an adhesive layer to the substrate 1 and/or the conductors to ensure reliable adhesion of the trimming layer 3a, 3b or the protective layer 4 to the resonators and/or the substrate 1. If the layer thickness of the adhesive layer is non-negligible, its dielectric properties must be considered in determining the thickness of the trimming layer 3a, 3b, 3c.

The inventive coating can either be applied to the resonators singly or to paired resonators (Helmholtz pairs). In the second case, the mounting tolerances that occur when pairing resonators and that can result in frequency differences up to 3 to 5 MHz can be compensated for. Alternatively, part of the manufacturing tolerances of the resonators can be corrected by controlled variation of the distance of the individual resonators in the Helmholtz pair and/or the yield of the resonator manufacturing can be increased by pairing a resonator with too high resonance frequency with a resonator with too low resonance frequency. If these or similar methods are used, the necessary trimming range becomes narrower and thinner layers 3a, 3b, 3c can be used. This is especially advantageous if the dielectric losses of the trimming layers 3a, 3b, 3c heavily influence resonator quality. In these cases, the quality of the individual resonators and of the Helmholtz pair can be maximized. This only changes the field homogeneity of the resonator pair slightly as long as the frequency difference between the resonators is not too large, in particular, less than 5%.

As an alternative, the first coating can already be implemented such that each resonator is covered with a different layer thickness to trim the resonance frequency of each resonator as near as possible to a target frequency for individual resonators. Fine trimming can then be performed by adjusting the distance between the resonators (i.e. by changing the coupling) in an analogous way to reference [6].

A major advantage of the inventive resonators is that the original state of the resonators can be restored by removing the trimming layer 3a, 3b, 3c. The trimming usually causes no irreversible change to the resonators, in particular, in cases where the trimming layer 3a, 3b, 3c can be removed by an etching process that is compatible with the substrate 1 and the conductive material (e.g. HTS layer).

To set the thickness of the dielectric layers 3a, 3b, 3c (trimming), conventional methods can be used to determine the thickness: for example, the layer thickness can be measured in situ using a detection system (e.g. quartz oscillator or laser interferometer) while applying the layer 3a, 3b, 3c. Alternatively, the resonator can be cooled to operating temperature during deposition of the dielectric layers 3a, 3b, 3c and the frequency measured in situ. This simplifies trimming because deposition can be stopped at the right moment, but is not compatible with all materials/processes.

In an alternative variant, a dielectric layer is initially applied that is "too thick" for the required resonance frequency. This dielectric layer is then etched to the required thickness. Just as for deposition in situ, the frequency can be measured if the resonator is cooled to operating temperature. In this case, etching is performed using plasma processes (such as reactive ion etching RIE) or ion beam etching. Alternatively, etching can be performed with wet-chemical processes. If etching is performed without in situ measurement, it is convenient to set the frequency using an iterative procedure unless the etching process can be so precisely calibrated that the necessary etching time can be calculated.

A mounting procedure of an inventive resonator system could therefore be as follows:
1. coating of the resonators with a dielectric layer 4 against voltage breakdowns.
2. characterization of the resonators according to resonance frequency.
3. pairing of resonators of different resonance frequencies and mounting to form a Helmholtz pair. The aim of this is to achieve a resonance frequency of the Helmholtz mode that is as close as possible to the defined target frequency
4. correction of the resonance frequency by coating the resonator system with a further dielectric layer 3c or by controlled removal by etching of the layer from step 1.

The local thickness of the dielectric layers 3a, 3b, 3c, 4 are almost constant over the resonator surface in the examples shown. But it can be advantageous to vary the local thickness over the surface of the resonator.

The layer thicknesses in which HTS layers are manufactured, are typically under 500 nm for substrates suitable for radio-frequency applications, but may be several μm (e.g. if MgO is used). The dielectric layers 3a, 3b, 3c should be thicker, if possible, than the electrically conductive layers 2 so that good coating can be ensured even at the edges of the conductors 2.

The trimming range that can be set by the electrical layer 3a, 3b, 3c depends on the dielectric constant of the substrate 1 and layer 3a, 3b, 3c, 4 and on the design of the resonator:

Typical values of the dielectric constant for substrate 1 that are used for HTS layers (LaAlO$_3$, MgO, sapphire, YAlO$_3$) are in the range $\epsilon$=9 to 25.

The dielectric constants of useful dielectric layers 3a, 3b, 3c are in the range 2 to 26, where especially polymer layers such as Parylene, and fluorinated polymers such as PTFE, FEP, PFA etc. are useful. Parylene has the advantage that deposition is performed at room temperature or colder from the gas phase completely isotropically. This reduces the risk of damage to the conductive structures 2 (HTS film) by overheating and chemical degradation. Fluorinated polymers are more often deposited from the solution and then polymerized at relatively high temperatures, which makes controlling the thickness of dielectric layer 3a, 3b, 3c difficult and can damage the HTS films. However, there are also methods for depositing fluoropolymers in the plasma, such that the thickness control and temperature control are similar to the Parylene process.

Moreover it is very simple to deposit oxides and nitrides, e.g. by sputtering, evaporating, plasma deposition, etc. In this case, the following are of interest: cerium oxide, silicon oxide, silicon nitride, silicates, aluminum oxide, titanium oxide, zirconium oxide, zirconium silicate, hafnium silicate and further materials, in particular Al$_2$O$_3$, Gd$_2$O$_3$, Yb$_2$O$_3$, Dy$_2$O$_3$, Nb$_2$O$_5$, Y$_2$O$_3$, La$_2$O$_3$, ZrO$_3$, HfO$_3$, TiO$_3$, Ta$_2$O$_3$, SrTiO$_3$, Ba$_x$Sr$_{1-x}$TiO$_3$, Zr$_x$Si$_{1-x}$O$_y$, Hf$_x$Si$_{1-x}$O$_y$, Al$_x$Zr$_{1-x}$O$_3$, Pr$_2$O$_3$, etc.

In addition to the controlled deposition conditions and the dielectric constants, there are numerous further requirements applying to the dielectric layers 3a, 3b, 3c. These can be divided into mechanical/process properties and electrical properties:

As regards the mechanical/process properties, adhesion to the substrate and to the HTS layer is important, flaking off and cracking of the dielectric layer should not occur even after several cycles of 2 K to 400 K. It should be feasible to etch the dielectric layer in the most controlled manner possible to enable thickness control after deposition. Moreover, the dielectric layer should form a chemical barrier against other substances that could destroy the HTS layers (in particular, water, acids and bases). They should be chemically so resistant that they are compatible with common cleaning processes, in particular, with solvents, such as alcohols and acetone.

Besides the dielectric constant, the most important electrical property of the inventive dielectric layer are lowest possible dielectric losses (i.e. the smallest possible loss tangent) and low electrical conductivity to avoid ruining the quality factor of the HTS resonators. Moreover, the dielectric layer should be as temperature-independent as possible. This reduces the requirements and the temperature stability of the resonators during operation. In particular, short-time temperature rises of the resonators due to the irradiation of pulsed or CW (continuous wave) RF power should not result in detuning. Further, the dielectric strength should be as high as possible to avoid electric discharges.

Figure 3A:
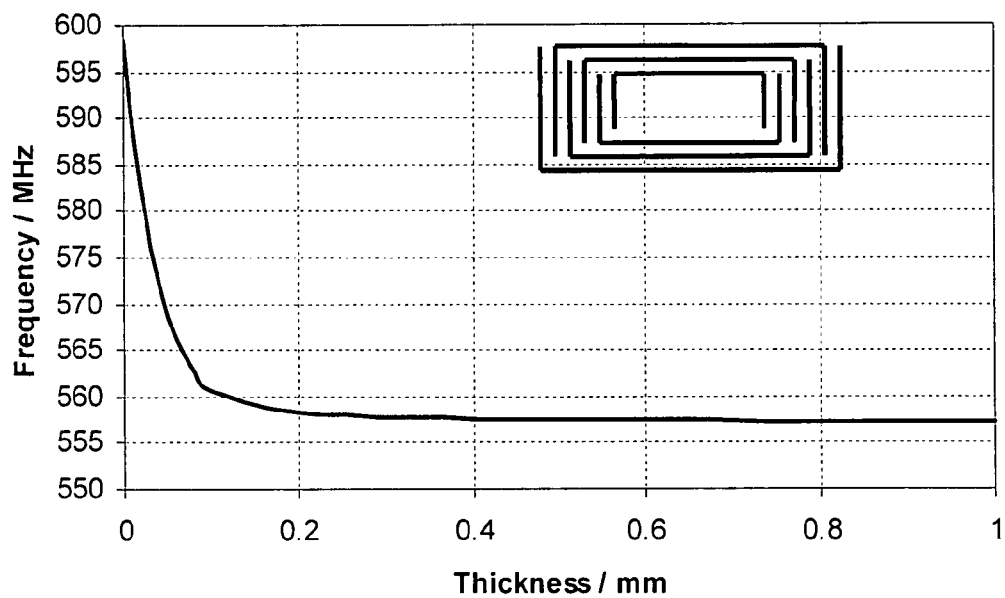
FIG. 3a a graph of the resonance frequency of an inventive resonator with localized capacitances as a function of the layer thickness of the dielectric layer.
Figure 3B:
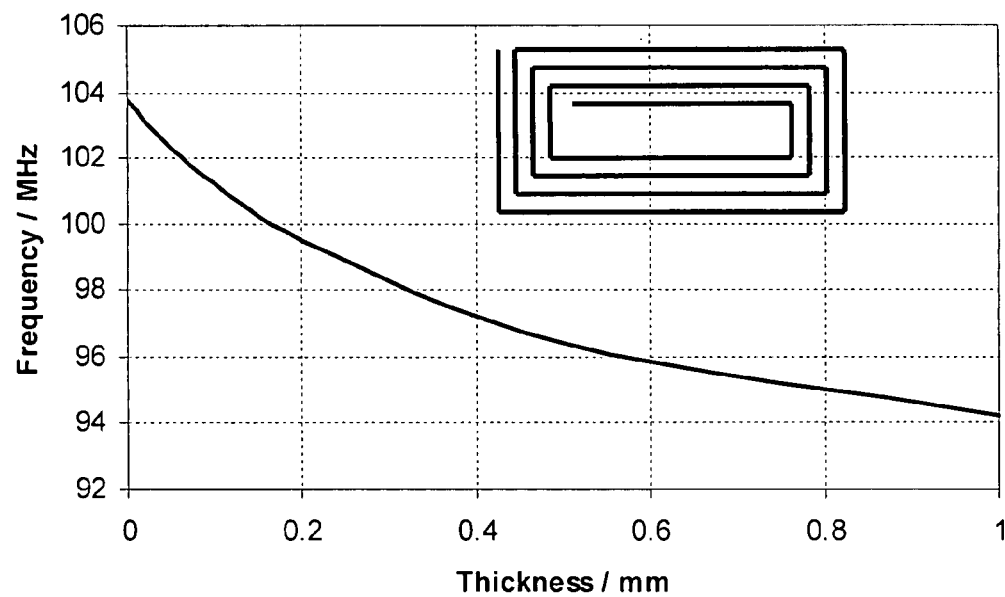
FIG. 3b a graph of the resonance frequency of an inventive spiral resonator as a function of the layer thickness of the dielectric layer.

FIGS. 3a and 3b show two examples of the frequency curve of resonators with different resonance frequencies and different designs but the same coating (Parylene N) as a function of the thickness of the Parylene N layer. The substrates are sapphire with a dielectric constant of approx. 10.

In the case shown in FIG. 3a, the resonator is of type "resonator with localized capacitances". These are produced by nesting conductors in certain regions of the resonator ("finger capacitors"), as shown in the diagram. On coating, the resonance frequency decreases in this specific case by approx. 40 MHz (equivalent to approx. 6.5%). Almost the entire frequency shift occurs in the range up to 100 μm. With further increasing thickness of the dielectric layer, the resonance frequency decreases by only a further 3 MHz (equivalent to 0.5%). This is a very advantageous situation because the trimming region is usually of the order of 1% of the resonance frequency. For such resonators trimming can therefore be performed with a very thin dielectric layer of only a few 10 μm.

Resonators of type "resonator with distributed capacitance" behave identically to the resonator shown in FIG. 3a with localized capacitances. Usually, the resonators are mixed types of both basic types.

The second type of resonator, which is shown in FIG. 3b, Is a "spiral resonator". In this case, a conductor is "wound" into a spiral and forms within certain bounds capacitances between adjacent conductor sections. However, this capacitive influence is relatively low here and the resonance frequency mainly arises from the standing-wave properties. Accordingly, the frequency dependency of the resonator is rather flat with a coating equivalent to the example of FIG. 3a. With a coating of 1 mm, a frequency shift of 10 MHz (corresponding to approx. 10%) is achieved. Saturation is not observed. This is because the electrical fields of such resonators are not spatially limited (unlike resonators with finger capacitors) but extend far into space. To trim such resonators, it is therefore necessary to use a dielectric layer with a high dielectric constant and relatively high thicknesses.

The situation is similar with resonator structures that are applied to substrates coated on both sides and in which the capacitance is mainly defined through the substrate. In such resonators, the influence of trimming due to coating is much less than in resonators with finger capacitors. The layer thicknesses must therefore be chosen to be relatively large.

Figure 4A:
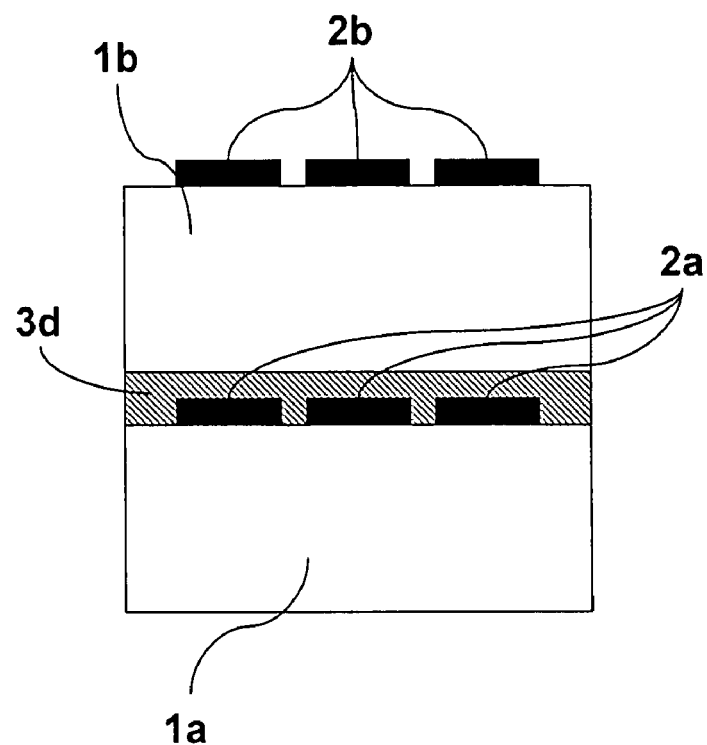
FIG. 4a a schematic section of a variant of a resonator with a substrate coated on both sides.
Figure 4B:
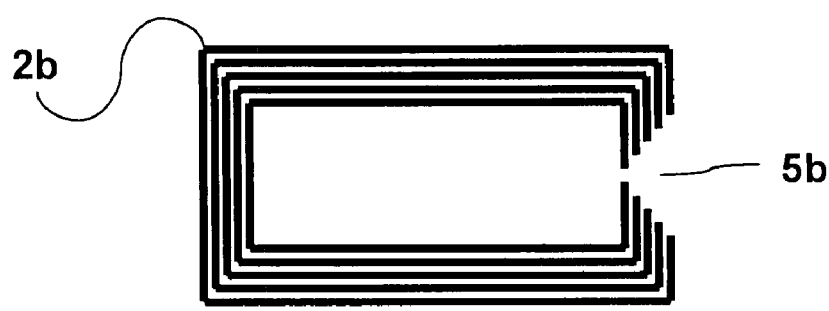
Figure 4C:
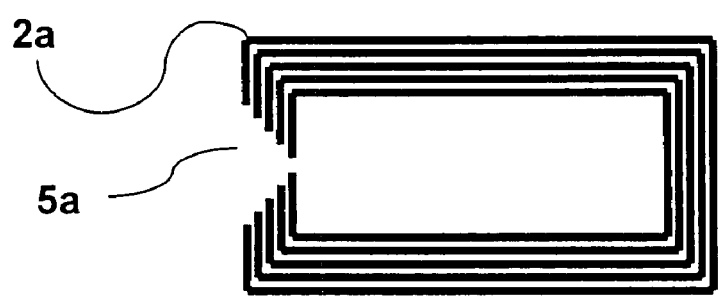
Figure 5:
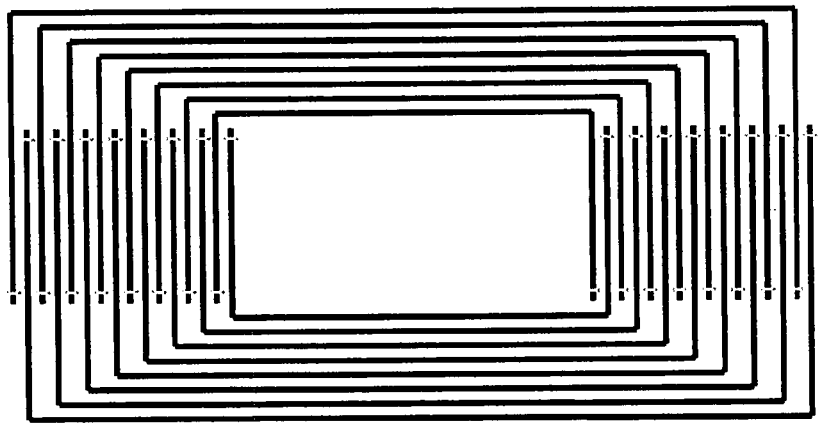
FIG. 5 a schematic illustration of a resonator trimmed using a laser trimming process according to prior art with simultaneous trimming of the capacitances.
Figure 6:
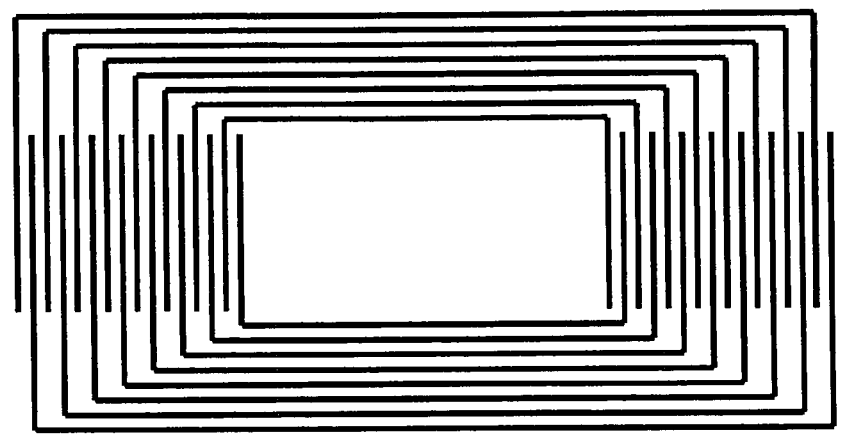
FIG. 6 a schematic illustration of a further resonator trimmed using a laser trimming process according to the prior art.

To counter this, one embodiment of the inventive resonator system has two resonators mounted one upon the other. Such a resonator system is shown in FIG. 4a. On both substrates 1a, 1b, conductive structures 2a, 2b are applied to one side. The two resonators with the conductive structures 2a, 2b are mounted in opposite directions such that the openings 5a, 5b of the conductors 2a, 2b are disposed on opposite sides, as shown in FIG. 4b and FIG. 4c. In the embodiment of the inventive resonator system shown in FIG. 4a, the resonators are placed such that the conductors 2a of one of the resonators face the substrate 1b of the other resonator. The resonators can however be mounted such that both substrates 1a, 1b face each other or that both substrates 1a, 1b face outward and the two conductive structures 2a, 2b are only separated by an additional dielectric. In all these types of resonator, a coating 3d on one or both conductive structures 2a, 2b and/or on the reverse side substrates 1a, 1b can be used for trimming, a very thin dielectric layer 3d already permitting a wide trimming range.

The inventive method can also be used for other types of resonator, for example, those in reference [7] and the references cited therein.

With the inventive method, resonator systems can be set to the required resonance frequency with high precision. This minimizes the risk of damage to the conductive structure.

REFERENCES

[1] DE3506471
[2] US 2005/0256009
[3] US 2004/0021466
[4] WO 2004/084340
[5] JP 04368006
[6] WO 2004102596
[7] DE 102004020167

REFERENCE DRAWING LIST

1 Substrate
1a Substrate
1b Substrate
2a Conductive structures (conductors)
2b Conductive structures (conductors)
2c Conductive structures (conductors)
3a Dielectric layer (trimming layer)
3b Dielectric layer (trimming layer)
3c Dielectric layer (trimming layer)
3d Dielectric layer (trimming layer)
4 Dielectric layer (protective layer)
5a Opening of the conductive structures
5b Opening of the conductive structures

I claim:

1. A radio-frequency (RF) resonator system, in particular, for a magnetic resonance (MR) probe head, the system comprising at least one RF resonator, the resonator comprising:
    a substrate;
    a conductive structure applied on said substrate, said conductive structure having regions of capacitive and inductive elements; and
    at least one dielectric layer applied to said conductive structure to coat and at least partially cover said regions of said capacitive elements, said at least one dielectric layer having a local thickness set in dependence on a resonance frequency of said RF resonator prior to coating, on a defined resonance frequency of said resonator once it is coated, on a dielectric constant of said substrate, and on a dielectric constant of materials of said at least one dielectric layer, wherein deposition of said at least one dielectric layer is performed using at least one of evaporation, plasma deposition, sputtering, or deposition from the gas or liquid phase, wherein material of said dielectric layer exhibits a dielectric constant similar to that of said substrate or, wherein a dielectric constant of said dielectric layer is between half and double the value of a dielectric constant of a substrate.

2. A method for trimming an RF resonator, the resonator having a substrate, a conductive structure applied on the substrate, the conductive structure having regions of capacitive and of inductive elements, and at least one dielectric layer, the method comprising the steps of:
    a) applying the at least one dielectric Layer to the conductive structure in the regions of the capacitive elements to at least partially cover those regions of the capacitive elements;
    b) measuring a resonance frequency of the resonator; and
    c) increasing or decreasing a thickness of the dielectric layer applied in step a) in dependence on the results of step b).

3. An RE resonator trimmed by the method of claim 2.

4. A radio-frequency (RF) resonator system, in particular, for a magnetic resonance (MR) probe head, the system comprising at least one RF resonator of claim 3, the resonator comprising:
    a substrate;
    a conductive structure applied on said substrate, said conductive structure having regions of capacitive and inductive elements; and
    at least one dielectric layer applied to said conductive structure to coat and at least partially cover said regions of said capacitive elements, said at least one dielectric layer having a local thickness set in dependence on a resonance frequency of said RF resonator prior to coating, on a defined resonance frequency of said resonator once it is coated, on a dielectric constant of said substrate, and on a dielectric constant of materials of said at least one dielectric layer.

5. The RF resonator of claim 3, wherein said conductive structures contains high-temperature superconducting (HTS) material.

6. The RF resonator claim 3, wherein a local thickness of at least one of said dielectric layer has a same value in all regions of the RE resonator.

7. The RF resonator of claim 3, wherein at least one of said dielectric layers completely covers the regions of said capacitive elements.

8. The RF resonator of claim 3, wherein at least one of said dielectric layers contains a material with a dielectric constant in a range of 2 to 26.

9. The RF resonator of claim 3, wherein at least one of said dielectric layers contains a material that is chemically resistant to solvents, to alcohol, to acetone, and/or to water, and which is impermeable or is impermeable to water vapor.

10. The RF resonator of claim 3, wherein at least one of said dielectric layers contains a material that exhibits an electrical conductivity σ, wherein $\sigma<10^{-3}$ S/m, $\sigma<10^{-5}$ S/m, $\sigma<10^{-8}$ S/m, and/or has a low loss factor tan δ, where $\tan\delta<10^{-3}$ or $\tan\delta<10^{-5}$.

11. The RF resonator of claim 3, wherein said dielectric layers comprise materials that exhibit a largely temperature-independent dielectric constant.

12. The RF resonator of claim 3, wherein at least one of said dielectric layers contains polymers, Parylenes, fluorinated polymers, FEP, PFA, PTFE, oxides and/or nitrides.

13. The RF resonator of claim 3, wherein at least one of said dielectric Layers exhibits a dielectric strength that is greater than $10^7$ V/m or greater than $10^8$ V/m.

14. The RF resonator of claim 3, wherein dielectric constants of said dielectric layers decrease as a distance from said conductive structures increases.

15. The RF resonator of claim 3, wherein said substrate contains a material with a dielectric constant $\epsilon_r$ in a range $9 \leq \epsilon_r \leq 25$, LaAlO$_3$, MgO, Al$_2$O$_3$ or YAlO$_3$.

16. An MR probe head having the RF resonator of claim 3.

17. The method of claim 2, wherein thickness of the at least one dielectric layer applied in step a) is selected in dependence on a resonance frequency of an uncoated resonator, on a target resonance frequency of the resonator once coated, on dielectric constant of the substrate, and on dielectric constant of materials of the dielectric layers.

18. The method of claim 2, wherein, after application of a first dielectric layer, a further dielectric layer is applied to the first dielectric layer and/or to the conductive structure.

19. The method of claim 2, wherein, after application of the dielectric layer, part of this layer is removed again or is removed by an etching process.

20. The method of claim 2, wherein, after application of the first dielectric layer, pairs of RF resonators with different resonance frequencies are mounted to form a Helmholtz pair.

* * * * *